United States Patent
Yasui

(10) Patent No.: US 11,765,877 B2
(45) Date of Patent: Sep. 19, 2023

(54) COMPONENT MOUNTING SYSTEM

(71) Applicant: FUJI CORPORATION, Chiryu (JP)

(72) Inventor: Yoshihiro Yasui, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 95 days.

(21) Appl. No.: 17/431,453

(22) PCT Filed: Mar. 5, 2019

(86) PCT No.: PCT/JP2019/008523
§ 371 (c)(1),
(2) Date: Aug. 17, 2021

(87) PCT Pub. No.: WO2020/178967
PCT Pub. Date: Sep. 10, 2020

(65) Prior Publication Data
US 2022/0132717 A1 Apr. 28, 2022

(51) Int. Cl.
*H05K 13/04* (2006.01)
*B23P 19/04* (2006.01)
*H05K 13/08* (2006.01)
*H05K 13/02* (2006.01)

(52) U.S. Cl.
CPC ....... *H05K 13/0882* (2018.08); *H05K 13/021* (2013.01)

(58) Field of Classification Search
CPC ............ H05K 13/021; H05K 13/0495; H05K 13/0857; H05K 13/085; H05K 13/0882
See application file for complete search history.

(56) References Cited

U.S. PATENT DOCUMENTS

| | | | | |
|---|---|---|---|---|
| 10,856,461 B2* | 12/2020 | Hirayama | .......... | H05K 13/0495 |
| 10,935,961 B2* | 3/2021 | Kuroda | ............ | G05B 19/41835 |
| 10,939,601 B2* | 3/2021 | Kondo | ............... | H05K 13/0417 |
| 10,996,657 B2* | 5/2021 | Yoriki | .................... | G06Q 10/08 |
| 11,212,951 B2* | 12/2021 | Kondo | ................ | H05K 13/086 |
| 2021/0289679 A1* | 9/2021 | Kawai | .................. | H05K 13/021 |
| 2022/0394895 A1* | 12/2022 | Kinoshita | ........... | H05K 13/086 |

FOREIGN PATENT DOCUMENTS

| | | |
|---|---|---|
| WO | WO 2017/033268 A1 | 3/2017 |
| WO | WO 2018/087854 A1 | 5/2018 |
| WO | WO 2018/092250 A1 | 5/2018 |

OTHER PUBLICATIONS

International Search Report dated May 14, 2019 in PCT/JP2019/008523 filed on Mar. 5, 2019 (2 pages).

* cited by examiner

*Primary Examiner* — Paul D Kim
(74) *Attorney, Agent, or Firm* — Oblon, McClelland, Maier & Neustadt, L.L.P.

(57) ABSTRACT

A component mounting system includes a component mounter group, a storage container, a loader, a host computer, and a production management computer. The host computer prepares jobs for each product based on a production plan for producing multiple types of products in which predetermined various types of components are mounted on a mounting target and sets a job in the jobs so prepared that satisfies a specified determination condition as a determined job. The production management computer shares the determined job with the host computer, makes a processing preparation for the determined job and thereafter causes the loader to unload and/or load component supply devices based on the results of the processing preparation for the determined job.

4 Claims, 7 Drawing Sheets

Fig. 4

| PRODUCTION PLAN | | | PRODUCTION JOBS | DETERMINATION FLAGS |
|---|---|---|---|---|
| PRODUCT NAMES | PRODUCTION VOLUMES | SCHEDULED PRODUCTION DAYS | | |
| PRODUCTION #1 | 29 | FIRST DAY | JOB #1 | 1 |
| PRODUCTION #2 | 66 | FIRST DAY | JOB #2 | 1 |
| PRODUCTION #3 | 45 | FIRST DAY | JOB #3 | 1 |
| PRODUCTION #4 | 71 | FIRST DAY | JOB #4 | 1 |
| PRODUCTION #5 | 71 | FIRST DAY | JOB #5 | 1 |
| PRODUCTION #6 | 39 | FIRST DAY | JOB #6 | 1 |
| PRODUCTION #7 | 39 | FIRST DAY | JOB #7 | 1 |
| PRODUCTION #8 | 11 | FIRST DAY | JOB #8 | 1 |
| PRODUCTION #9 | 11 | FIRST DAY | JOB #9 | 1 |
| PRODUCTION #10 | 22 | FIRST DAY | JOB #10 | 1 |
| PRODUCTION #11 | 22 | FIRST DAY | JOB #11 | 1 |
| PRODUCTION #12 | 41 | FIRST DAY | JOB #12 | 1 |
| PRODUCTION #13 | 41 | SECOND DAY | JOB #13 | 0 |
| PRODUCTION #14 | 9 | SECOND DAY | JOB #14 | 0 |
| PRODUCTION #15 | 9 | SECOND DAY | JOB #15 | 0 |
| PRODUCTION #16 | 17 | SECOND DAY | JOB #16 | 0 |
| PRODUCTION #17 | 17 | SECOND DAY | JOB #17 | 0 |
| PRODUCTION #18 | 10 | SECOND DAY | JOB #18 | 0 |
| PRODUCTION #19 | 10 | SECOND DAY | JOB #19 | 0 |
| PRODUCTION #20 | 43 | SECOND DAY | JOB #20 | 0 |
| PRODUCTION #21 | 43 | SECOND DAY | JOB #21 | 0 |
| PRODUCTION #22 | 38 | SECOND DAY | JOB #22 | 0 |
| PRODUCTION #23 | 38 | SECOND DAY | JOB #23 | 0 |
| PRODUCTION #24 | 22 | SECOND DAY | JOB #24 | 0 |
| PRODUCTION #25 | 22 | SECOND DAY | JOB #25 | 0 |
| PRODUCTION #26 | 22 | SECOND DAY | JOB #26 | 0 |
| PRODUCTION #27 | 22 | SECOND DAY | JOB #27 | 0 |

Fig. 8

| PRODUCTION PLAN | | | PRODUCTION JOBS | DETERMINATION FLAGS |
|---|---|---|---|---|
| PRODUCT NAMES | PRODUCTION VOLUMES | SCHEDULED PRODUCTION DAYS | | |
| PRODUCTION #1 | 29 | FIRST DAY | JOB #1 | 1 |
| PRODUCTION #2 | 66 | FIRST DAY | JOB #2 | 1 |
| PRODUCTION #3 | 45 | FIRST DAY | JOB #3 | 1 |
| PRODUCTION #4 | 71 | FIRST DAY | JOB #4 | 1 |
| PRODUCTION #5 | 71 | FIRST DAY | JOB #5 | 1 |
| PRODUCTION #6 | 39 | FIRST DAY | JOB #6 | 1 |
| PRODUCTION #7 | 39 | FIRST DAY | JOB #7 | 1 |
| PRODUCTION #8 | 11 | SECOND DAY | JOB #8 | 0 |
| PRODUCTION #9 | 11 | SECOND DAY | JOB #9 | 0 |
| PRODUCTION #10 | 22 | FIRST DAY | JOB #10 | 1 |
| PRODUCTION #11 | 22 | FIRST DAY | JOB #11 | 1 |
| PRODUCTION #12 | 41 | FIRST DAY | JOB #12 | 1 |
| PRODUCTION #13 | 41 | SECOND DAY | JOB #13 | 0 |
| PRODUCTION #14 | 9 | SECOND DAY | JOB #14 | 0 |
| PRODUCTION #15 | 9 | SECOND DAY | JOB #15 | 0 |
| PRODUCTION #16 | 17 | SECOND DAY | JOB #16 | 0 |
| PRODUCTION #17 | 17 | SECOND DAY | JOB #17 | 0 |
| PRODUCTION #18 | 10 | SECOND DAY | JOB #18 | 0 |
| PRODUCTION #19 | 10 | SECOND DAY | JOB #19 | 0 |
| PRODUCTION #20 | 43 | SECOND DAY | JOB #20 | 0 |
| PRODUCTION #21 | 43 | SECOND DAY | JOB #21 | 0 |
| PRODUCTION #22 | 38 | SECOND DAY | JOB #22 | 0 |
| PRODUCTION #23 | 38 | SECOND DAY | JOB #23 | 0 |
| PRODUCTION #24 | 22 | SECOND DAY | JOB #24 | 0 |
| PRODUCTION #25 | 22 | SECOND DAY | JOB #25 | 0 |
| PRODUCTION #26 | 22 | SECOND DAY | JOB #26 | 0 |
| PRODUCTION #27 | 22 | SECOND DAY | JOB #27 | 0 |

COMPONENT MOUNTING SYSTEM

TECHNICAL FIELD

The present description discloses a component mounting system.

BACKGROUND ART

As a component mounting system, as described in Patent Literature 1, there has been known a component mounting system in which a storage container is provided at an upstream side of a component mounter group that is made up by aligning multiple component mounters along a board conveyance direction, and a loader automatically unloads and/or loads feeders from and/or in the component mounters and the storage container. In this component mounting system, a production management computer obtains a job from a host computer, whereafter the production management computer controls an automatic exchange of feeders by the loader based on the job so obtained. The job is a command determining which types of components are mounted on a circuit board in which order for each component mounter and is determined for each product (a circuit board on which predetermined types of components are mounted).

PATENT LITERATURE

Patent Literature 1: International Publication No. 2018/087854

BRIEF SUMMARY

Technical Problem

Incidentally, in such a component mounting system, jobs are prepared based on a production plan which determines the number of products to be fabricated for each of multiple types of products, and products are produced based on each job. Before switching jobs from the job that is in process currently to a subsequent job, the production management computer controls the loader to change the current feeder arrangement to a feeder arrangement matching a subsequent job for each component mounter. In a case that the production management computer is made to obtain all the jobs contained in the production plan, however, the number of jobs that the production management computer obtains becomes too great, resulting in a problem in that the job processing preparation by the production management computer becomes complicated.

The present disclosure has been made in view of the problem described above, and a main object thereof is to alleviate the load borne by the production management computer in making the job processing preparation.

Solution to Problem

According to the present disclosure, there is provided a component mounting system including:

a component mounter group made up by aligning multiple component mounters, each including multiple component supply devices that are set detachably therein and configured to mount components supplied by the multiple component supply devices on a mounting target, in a conveyance direction of the mounting target;

a storage container configured to detachably support some of the multiple component supply devices in an aligned fashion;

a loader configured to move along the conveyance direction so as to automatically unload and/or load the component supply device from and/or in the component mounter and the storage container;

a host computer configured to prepare, based on a production plan for producing various types of products in each of which predetermined various types of components are mounted on the mounting target, a job for each of the products and set a job in the jobs so prepared which satisfies a specified determination condition as a determined job; and a production management computer configured to share the determined job with the host computer, make a preparation for processing the determined job, and thereafter cause the loader to unload and/or load the component supply device based on a result of the preparation for processing the determined job.

In the component mounting system of the present disclosure, the determined job, which satisfies the specified determination condition, in the jobs prepared based on the production plan is shared between the host computer and the production management computer. After having made the preparation for processing the determined job, the production management computer causes the loader to unload and/or load the component supply device based on the result of the determined job processing preparation. As a result, the production management computer does not make a preparation for processing all the jobs but makes a preparation for processing the determined job. Consequently, the load borne by the production management computer in making a job processing preparation is alleviated.

BRIEF DESCRIPTION OF DRAWINGS

FIG. 4 is a table showing an example of a production plan or the like.

FIG. 8 is a table showing an example of a production plan or the like after a change.

DESCRIPTION OF EMBODIMENTS

Figure 1:
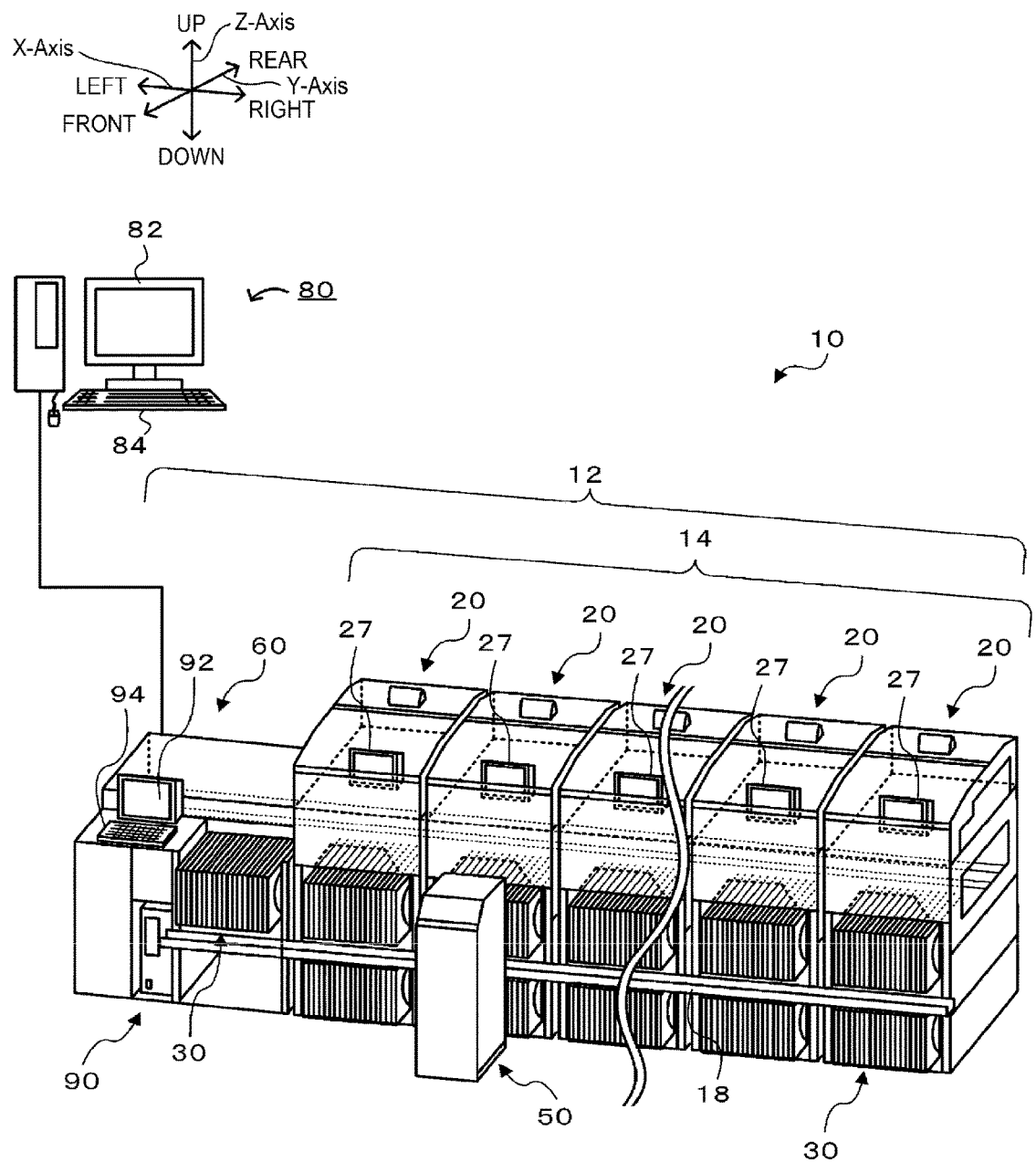
FIG. 1 is a perspective view showing schematically component mounting system 10.
Figure 2:
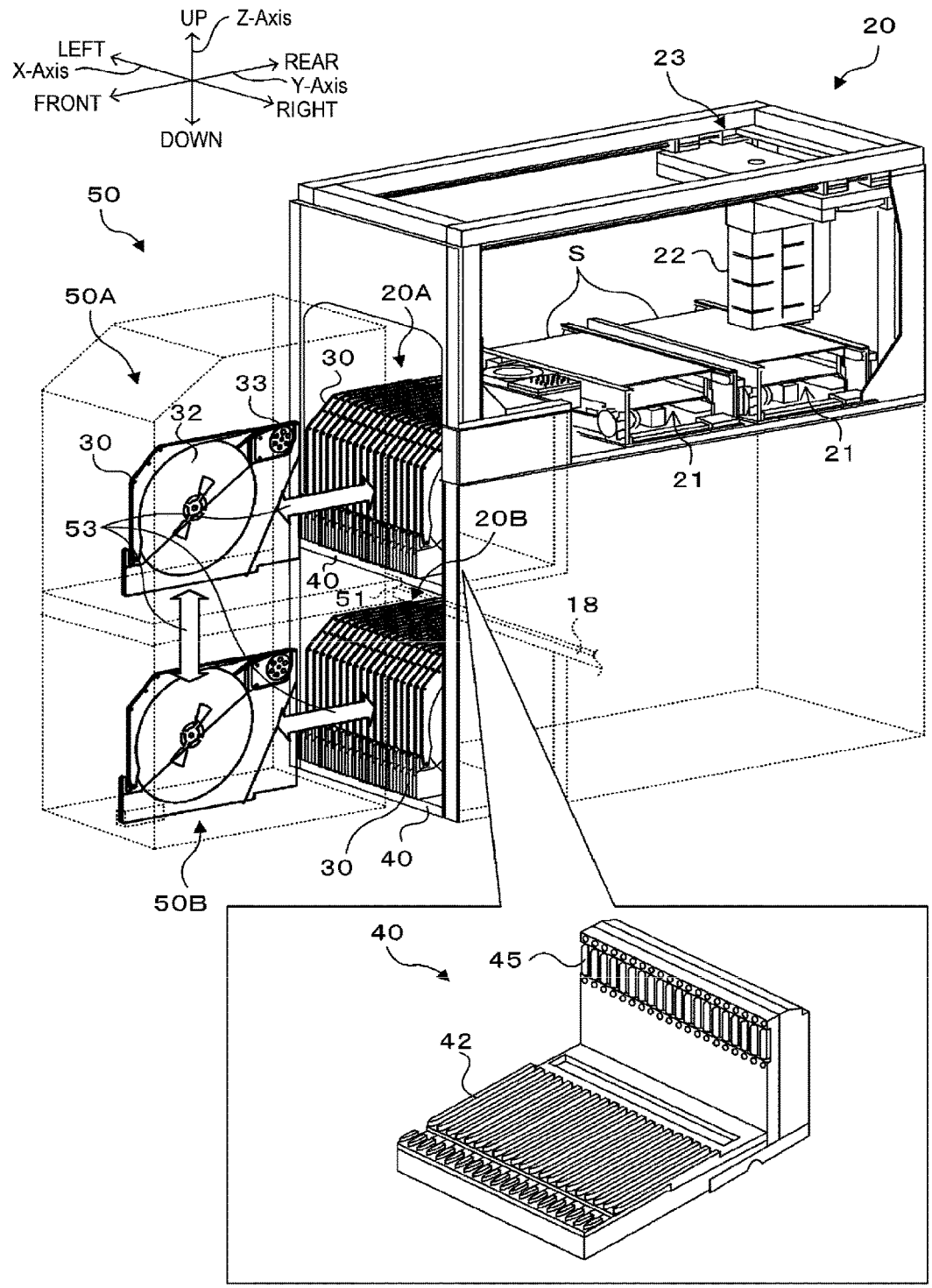
FIG. 2 is a perspective view showing schematically component mounter 20.
Figure 3:
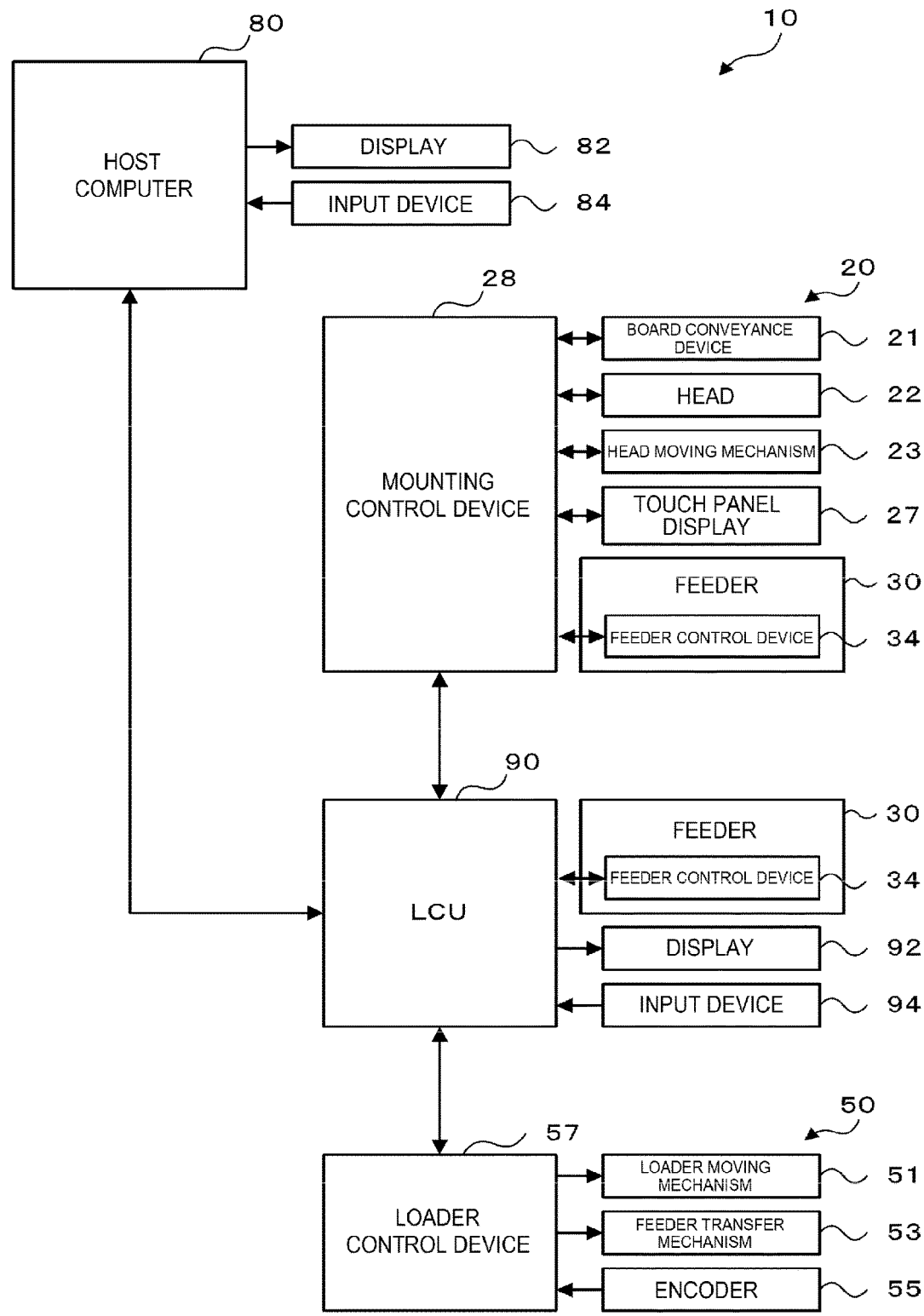
FIG. 3 is a block diagram showing a configuration for controlling component mounting system 10.

Next, referring to drawings, an embodiment of the present disclosure will be described. FIG. 1 is a perspective view showing schematically component mounting system 10 according to the present embodiment, FIG. 2 is a perspective view showing schematically component mounter 20, and FIG. 3 is a block diagram showing a configuration for controlling component mounting system 10. In FIG. 1, a left-right direction is an X-direction, a front-rear direction is a Y-direction, and an up-down direction is a Z-direction.

As shown in FIG. 1, component mounting system 10 includes component mounting line 12, loader 50, host computer (hereinafter, referred to as a host) 80, and line control unit (hereinafter, referred to as LCU) 90. In component mounting line 12, component mounter group 14 and feeder storage container 60 are aligned in the X-direction. In component mounter group 14, multiple component mounters 20 are aligned in the X-direction. Component mounter 20 mounts a component supplied from feeder 30 on board S (refer to FIG. 2). Board S is conveyed from a left side (an upstream side) to a right side (a downstream side) of component mounting line 12 along the X-direction. Feeder storage container 60 is disposed at an upstream side of component mounter group 14 and stores feeders 30 scheduled to be used or feeders 30 that have been used up in component mounter 20. Loader 50 can automatically exchange feeders 30 between component mounter 20 or feeder storage container 60 and itself. Host 80 is a computer configure to manage mainly a production plan. The production plan is a plan which determines a production date, a type and number of products to be fabricated, and the like. In the present specification, board S on which predetermined various types of components are mounted is referred to as a product. LCU 90 is a computer for managing the production of products, that is, a production management computer, and manages component mounting line 12 and controls loader 50.

As shown in FIG. 2, component mounter 20 includes board conveyance device 21 for conveying board S in the X-direction, head 22 having a nozzle for picking up a component supplied by feeder 30, head moving mechanism 23 for moving head 22 in the XY-directions, and touch panel display 27 (refer to FIG. 1). In addition, component mounter 20 includes mounting control device 28 (refer to FIG. 3) made up of known CPU, ROM, RAM, and the like. Mounting control device 28 controls component mounter 20 as a whole. Mounting control device 28 can receive input signals from and transmit output signal to board conveyance device 21, head 22, head moving mechanism 23, touch panel display 27, and the like. In addition, component mounter 20 has two upper and lower areas where feeders 30 can be loaded at a front part thereof. The upper area is supply area 20A where feeders 30 can supply components, and the lower area is stock area 20B where feeders 30 can be stocked. Pallet 40 having an L-shape in a side view is provided in supply area 20A and stock area 20B. Pallet 40 supports detachably multiple feeders 30 which are aligned in a row.

As shown in FIG. 2, feeder 30 is configured as a tape feeder designed to feed out a tape accommodating components at a predetermined pitch. Feeder 30 includes tape reel 32 around which a tape is wound, tape feeding mechanism 33 for feeding out the tape from tape reel 32, and feeder control device 34 (refer to FIG. 3). As shown in FIG. 2, pallet 40 includes multiple slots 42 which are arranged in the X-direction at such intervals that enable feeders 30 to be inserted thereinto. When feeder 30 is inserted into slot 42 in pallet 40, a connector, not shown, of feeder 30 is connected to connector 45 of pallet 40. As a result, feeder control device 34 can communicate with a control section (control device 28, LCU 90, or the like) of a loading destination of feeder 30. Feeder control device 34 causes tape feeding mechanism 33 to feed out a component accommodated in the tape to a specified component supply position and causes again tape feeding mechanism 33 to feed out a component stored in the tape to the specified component supply position when the component supplied beforehand to the component supply position is picked up by the nozzle of head 22.

As shown in FIG. 1, loader 50 can move along X-axis rail 18 provided on front surfaces of multiple component mounters 20 and a front surface of feeder storage container 60 in parallel to the board conveyance direction (X-direction). As shown in FIGS. 2 and 3, loader 50 includes loader moving mechanism 51 and feeder transferring mechanism 53. Loader moving mechanism 51 moves loader 50 along X-axis rail 18. Feeder transfer mechanism 53 is configured to load feeder 30 in component mounter 20 or feeder storage container 60 from loader 50, unload feeder 30 from component mounter 20 or feeder storage container 60 to store that feeder 30 in loader 50, and move feeder 33 between upper transfer area 50A and lower transfer area 50B. In addition, as shown in FIG. 3, loader 50 also includes encoder 55 and loader control device 57. Encoder 55 detects a movement position of loader 50 in the X-direction. Loader control device 57 is made up of known CPU, ROM, RAM, and the like. Loader control device 57 receives a detection signal input from encoder 55 and outputs a drive signal to loader moving mechanism 51 and feeder transfer mechanism 53.

As shown in FIG. 1, feeder storage container 60 has pallet 40 similar to those of component mounter 20 in order to store multiple feeders 30.

Host 80 is made up of known CPU, ROM, RAM, HDD, and the like, and is connected to display 82 which is LCD or the like, input device 84 which is a keyboard or a mouse, and the like. Host 80 is connected with LCU 90 to enable a bidirectional communication therebetween. The HDD of host 80 stores a production plan, a production job, and the like. The production plan is stored in the HDD of host 80 by an operator who operates input device 84. An example of the production plan is shown in FIG. 4. The production plan in FIG. 4 is set such that 29 products #1, 66 products #2, 45 products #3, . . . , and 41 products #12 are produced on a first day, and 41 products #13, 9 products #14, 9 products #15, . . . , and 22 products #27 are produced on a second day. A production order is an order of products #1, #2, . . . , #27 (that is, an ascending order of the numbers assigned to the products). The production job is determined for each product and determines which types of components are mounted on board S in which order for each component mounter 20. Specifically, when board S passes from component mounter 20 situated furthest to the upstream (leftmost in FIG. 1) to component mounter 20 situated furthest to the downstream (rightmost in FIG. 1) of component mounter group 14, predetermined various types of components are mounted on board S, which then constitutes a product. The production job is prepared by the CPU of host 80 based on products specified in the production plan and is then stored in the HDD of host 80. The production job is optimized in order to increase the production efficiency of component mounting line 12. Specifically, the production job is set so as to maximize the production efficiency of component mounting line 12 by minimizing the movement distance and movement time of head 22 by optimizing the mounting order of components on board S and optimizing the arrangement of feeders 30 to be set in component mounter 20. Since the optimization of the production job is well known in the field of component mounter 20, the details of the optimization will be omitted here. An example of a production job is shown in FIG. 4. In FIG. 4, job #n (n is a natural number) is a job prepared to produce product #n.

LCU 90 is made up of known CPU, ROM, RAM, HDD, and the like, and is connected to display 92 which is LCD, input device 94 which is a keyboard or a mouse, and the like. LCU 90 is connected with host 80 to enable a bidirectional communication therebetween and is also connected with mounting control device 28 and loader control device 57 to enable a bidirectional communication therewith. LCU 90 shares a determined job (one type of production job), which will be described later, with host 80, and transmits the determined job to mounting control device 28. LCU 90 receives information on a mounting status of component mounter 20 from mounting control device 28 and receives information on a driving status of loader 50 from loader control device 57. LCU 90 is communicably connected with feeder control device 34 of feeder 30 so that information on feeder 30 stored in feeder storage container 60 or feeder 30 loaded in component mounter 20 can be obtained.

Next, an action of mounting components on board S (a component mounting action) based on a determined job that mounting control device 28 of component mounter 20 receives from LCU 90 will be described. First of all, mounting control device 28 causes the nozzle of head 22 to pick up a component supplied from feeder 30. Specifically, mounting control device 28 causes head moving mechanism 23 to move the nozzle of head 22 to a position situated directly above a component supply position of a desired component. Next, mounting control device 28 causes the nozzle to lower and supplies a negative pressure to the nozzle. As a result, the desired component is picked up to a distal end of the nozzle. Thereafter, mounting control device 28 causes the nozzle to rise and causes head moving mechanism 23 to move the nozzle which has picked up the component to a position situated above a specified position on board S. Then, in the specified position, mounting control device 28 causes the nozzle to lower and supplies the atmospheric pressure to the nozzle. As a result, the component held to the nozzle through suction is allowed to move apart from the nozzle to be mounted in the specified position on board S. Other components to be mounted on substrate S are also mounted on board S in the similar manner, and when all the components are completely mounted on board S, mounting control device 28 feeds out substrate S to adjacent downstream component mounter 20. When board S is discharged from component mounter 20 situated furthest to the downstream of component mounter group 14, the predetermined various types of components are mounted on board S, which then constitutes a product.

Figure 5:
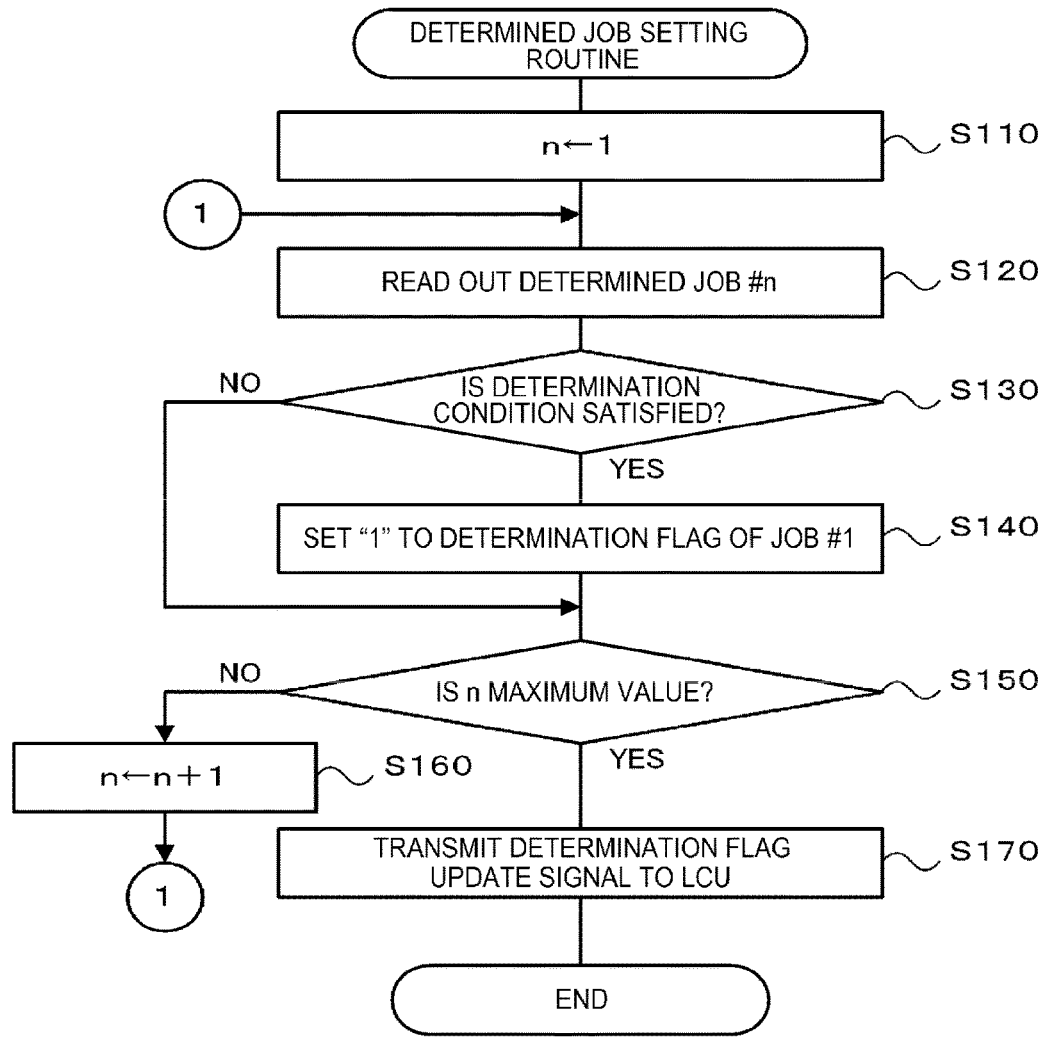
FIG. 5 is a flowchart of a determined job setting routine.

Next, a determined job setting routine executed by host 80 will be described. FIG. 5 is a flowchart of a determined job setting routine. This routine is executed, for example, before a production is started. It is assumed that a determination flag for each job is reset at zero before this routine is started. When starting this routine, the CPU of host 80 first sets a count number n of a counter to 1 (S110), reads out job #n from the HDD of host 80 (S120), and determines whether job #n satisfies a specified determination condition (S130). Here, the specified determination condition is a condition that a scheduled production data is today or a present day. That is, a job in the jobs that is completed within one day counting from a production starting point satisfies the determination condition. If it determines in S130 that job #n satisfies the determination condition, the CPU of host 80 sets 1 to the determination flag of job #n (S140). The job in which 1 is set to the determination flag is referred to as a determined job. The CPU of host 80 determines whether count number n is a maximum value (S150) after S140 or after a negative determination is made in S130, and if it determines that count number n is not a maximum value, the CPU of host 80 increments count number n by 1 (S160), and the routine returns to S120 again. On the other hand, if it determines that count number n is a maximum value in S150, the CPU of host 80 transmits to LCU 90 a determination flag update signal indicating that the determination flag has been updated (S170), and this routine ends. FIG. 4 shows an example of a determination flag corresponding to the production plan and the production jobs that are described above. FIG. 4 shows a case in which the present day is a first day of the scheduled production dates. As a result, although determination flags of jobs whose scheduled production dates are not the first day remain zero, determination flags of jobs whose scheduled production dates are the first day are updated from zero to 1. In FIG. 4, the maximum value of n is 27.

Figure 6:
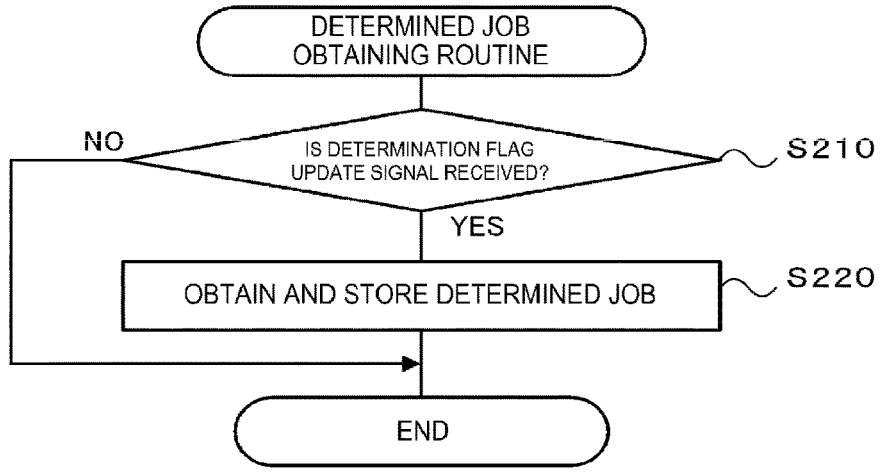
FIG. 6 is a flowchart of a determined job obtaining routine.

Next, a determined job obtaining routine executed by LCU 90 will be described. FIG. 6 shows a flowchart of a determined job obtaining routine. This routine is executed at specified timings (for example, every several minutes). When starting this routine, the CPU of LCU 90 determines whether it has received the determination flag update signal from host 80 (S210), and if LCU 90 has received no such determination flag update signal, this routine ends as it is. On the other hand, if the CPU of LCU 90 determines in S210 that LCU 90 has received the determination flag update signal, the CPU of LCU 90 copies the job whose determination flag is set to 1 (the determined job) from the HDD of host 80 to the HDD of LCU 90 (S220), and this routine ends. For example, in FIG. 4, since the determination flags of jobs #1 to #12 are set to 1, jobs #1 to #12 are copied on to the HDD of LCU 90. As a result, LCU 90 shares jobs #1 to #12 which are determined jobs with host 80.

Figure 7:
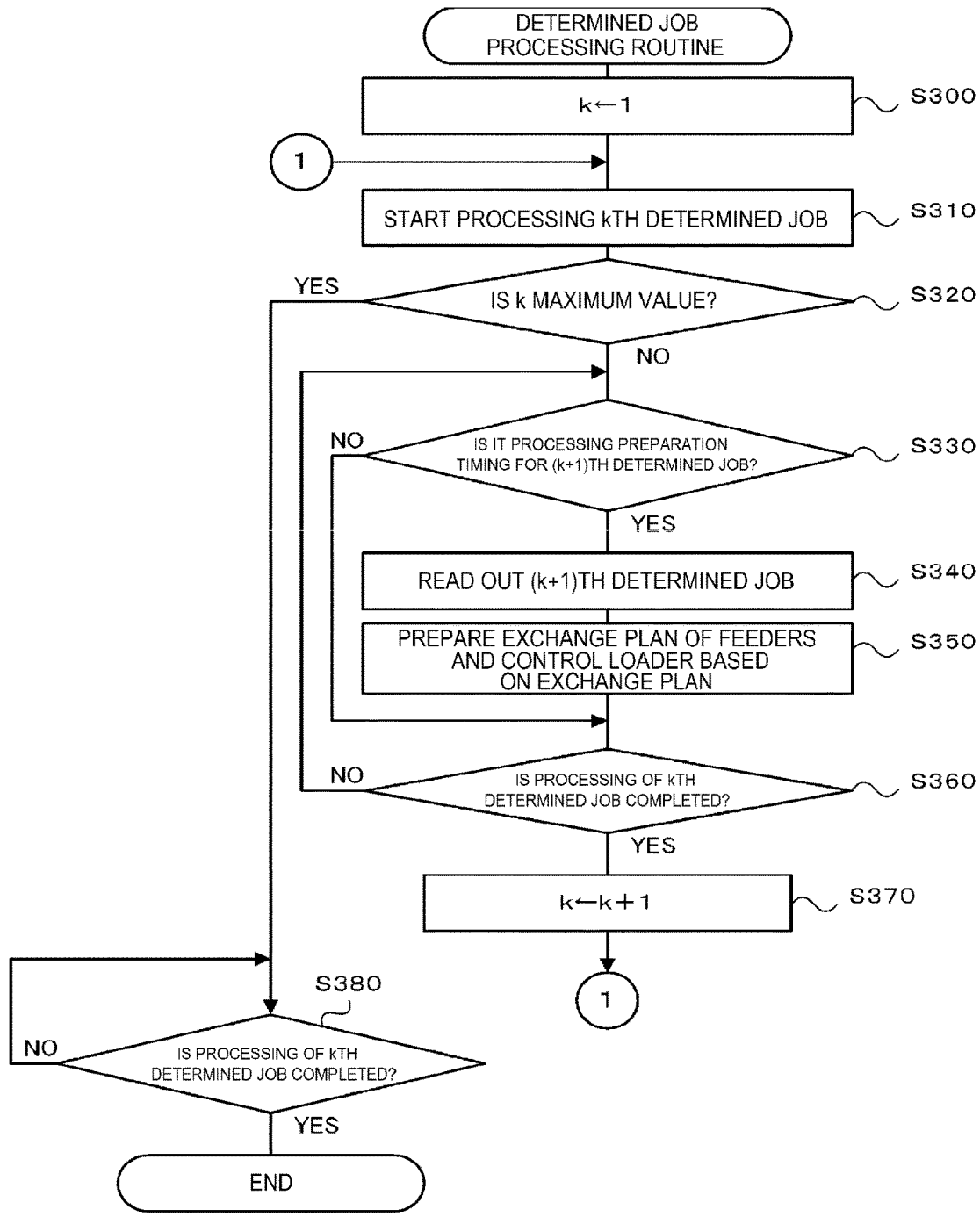
FIG. 7 is a flowchart of a determined job processing routine.

Next, a determined job processing routine executed by LCU 90 will be described. FIG. 7 is a flowchart of a determined job processing routine. This routine is started by LCU 90 when the operator inputs a command to start a production from input device 94 of LCU 90. When starting this routine, the CPU of LCU 90 first sets 1 to count number k (S300), reads out a kth determined job from the HDD of LCU 90, and starts processing the determined job so read out (S310). For example, in FIG. 4, jobs #1 to #12 are determined jobs and are referred sequentially to as a first determined job, a second determined job, . . . , in the order in which the job numbers increase. The determined jobs determine which types of components are mounted on board S in which order for corresponding component mounters 20. As a result, feeders 30 are arranged differently from component mounter 20 to component mounter 20. In S310, LCU 90 controls loader 50 in accordance with arrangements of feeders 30 determined for component mounters 20 for the kth determined job. LCU 90 causes loader 50 to unload feeders 30 from feeder storage container 60 to load them in component mounters 20 accordingly for a first determined job. In addition, LCU 90 transmits the kth determined job to mounting control device 28 of each component mounter 20. Each component mounter 20 mounts components allocated thereto on board S in the kth determined job.

Subsequently, the CPU of LCU 90 determines whether k is a maximum value (S320), and if k is not the maximum value, the CPU of LCU 90 determines whether a processing preparation timing for a subsequent, that is, a (k+1)th determined job is reached (S330). In FIG. 4, the maximum value of k is 12. The processing preparation timing is set, for example, at a timing that can give such good timely margins that loader 50 can completely arrange feeders 30 for the (k+1)th determined job before the processing of (k+1)th determined job is started towards the end of the processing of the kth determined job. If the processing preparation timing for the (k+1)th determined job is reached in S330, the CPU of LCU 90 reads out the (k+1)th determined job (S340), prepares an exchange plan of feeders 30 in accordance with the arrangement of feeders 30 for each component mounter 20 determined by the determined job so read out, and controls loader 50 based on the exchange plan (S 350).

The exchange plan of feeders 30 is a plan that determines which feeders 30 are returned to feeder storage container 60, which feeders 30 are unloaded from feeder storage container 60, which feeders 30 are disposed in slots 42 of supply area 20A or stock area 20B of which component mounter 20, and which feeders 30 are disposed in slots 42 of upper transfer area 50A or lower transfer area 50B of loader 50. Basically, this exchange plan is determined based on the kth determined job and the (k+1)th determined job; however, there may be a case in which the exchange plan is determined in consideration of determined jobs from a (k+2)th determined job onward. For example, in feeders 30 that are used in the kth determined job, feeders 30 that are not used in the (k+1)th determined job but are used in any determined job from the (k+2)th determined job onward are moved from supply area 20A to stock area 20B, or feeders 30 that are not used in any determined job from (k+1)th determined job onward are returned from supply area 20A to feeder storage container 60. In S350, the CPU of LCU 90 causes loader 50 to move feeders 30 between upper transfer area 50A and lower transfer area 50B, to load and store feeders 30 in component mounter 20 or feeder storage container 60 in areas 50A, 50B, and to load feeders 30 in areas 50A, 50B in component mounter 20 or feeder storage container 60 based on the exchange plan of feeders 30.

On the other hand, the CPU of LCU 90 determines whether component mounting line 12 completes the processing of the kth determined job (S360) after a negative determination is made in S330 or after S350, and if it determines that component mounting line 12 has not completed the processing, the routine returns to step 330 again. On the other hand, if the CPU of LCU 90 determines in S360 that component mounting line 12 has completed the processing of kth determined job, the CPU of LCU 90 increments k by 1 (S370), and the routine returns to S310 again. In addition, if k is the maximum value in S320, that is, if the kth determined job is a final determined job, the CPU of LCU 90 waits for component mounting line 12 to complete the processing of the final determined job (S 380), and this routine ends.

Next, a case will be described in which a determined job is changed in host 80. In a case that the production plan is changed, the CPU of host 80 executes the determined job setting routine again. A production plan change is executed by the operator who inputs a change operation from input device 84 of host 80. For example, in the production plan shown in FIG. 4, it is assumed that the scheduled production dates of jobs #8, #9 are changed from the first day to the second day due to some reasons. In this case, the production plan in FIG. 4 is changed to a production plan as shown in FIG. 8. Then, when the determined job setting routine is executed based on the changed production plan, the determination flags of jobs #8, #9 are reset to zero since jobs #8, #9 do not satisfy the specified determination condition. That is, jobs #8, #9 are updated from the determined jobs to determination cancelled jobs. As a result, the determined jobs remain as jobs #1 to #7 and jobs #10 to #12. Thereafter, when the CPU of LCU 90 executes the determined job obtaining routine, the determined jobs stored in the HDD of LCU 90 are updated to jobs #1 to #7 and Jobs #10 to #12. That is, the determination cancelled jobs are shared between host 80 and LCU 90, and jobs #8, #9 are excluded from the determined jobs. Then, in the HDD of LCU 90, jobs #1 to #7 constitute the first to seventh determined jobs, and jobs #10 to #12 constitute the eighth to tenth determined jobs. As a result, in the determined job processing routine, a processing preparation for job #10 is performed in the middle of processing job #7, and no processing preparation is performed for jobs #8, #9 which constitute the determination cancelled jobs. Jobs #8, #9 are not taken into consideration in preparation of an exchange plan of feeders 30.

In the present embodiment that has been described heretofore, the determined jobs, which satisfy the specified determination conditions, in the jobs prepared based on the production plan are shared between host 80 and LCU 90. After having made the processing preparation for the determined job, LCU 90 causes loader 50 to unload and/or load feeders 30 based on the result of the processing preparation of the determined job. That is, LCU 90 does not perform the processing preparation for all the jobs but performs the processing preparation for the determined job. This alleviates the load borne by LCU 90 in making the processing preparation for the jobs.

In addition, LCU 90 prepares the exchange plan of feeders 30 that is executed by loader 50 based on the determined job as the processing preparation for the determined job. That is, not all the jobs constitute a preparation target for preparing the exchange plan, but the determined jobs constitute a preparation target for preparing the exchange plan. This alleviates the load borne by LCU 90 in preparation of the exchange plan.

Further, if there is a determination cancelled job whose determination is cancelled in the determined jobs, host 80 shares the determination cancelled job with LCU 90, and LCU 90 excludes the determination cancelled job from the determined jobs. As a result, LCU 90 does not make the processing preparation for the job in the determined jobs whose determination is cancelled. This alleviates further the load borne by LCU 90 in making the processing preparation for the jobs.

In addition, since the jobs that are assumed to be completed within the present day are made to constitute the determination condition, the number of determined jobs is limited. This also alleviates the load borne by LCU 90 in making the processing preparation for the determined jobs.

Thus, needless to say, the present disclosure is not limited to the embodiment that has been described heretofore at all, and hence, the present disclosure can be carried out in various forms without departing from the technical scope of the present disclosure.

For example, although the production plan of two days (the scheduled production dates are the first day and the second day) is exemplified in FIG. 4 in the embodiment that has been described heretofore, the present disclosure is not limited particularly to this example. For example, a production plan of one week may also be adopted, or a production plan of 10 days may also be adopted.

In the embodiment that has been described heretofore, the condition that the scheduled production date is the present day (that is, the determined job is a job that is expected to be completed on the present day) is adopted as the determination condition; however, the present disclosure is not particularly limited thereto. For example, as the determination condition, a condition may be adopted that the scheduled production date is the morning or afternoon of the present day (that is, the determined job is a job that is expected to be completed within half a day), or a condition may be adopted that the scheduled completion date extends over two days (that is, the determined job is a job that is expected to be completed in two days). Alternatively, the determination flags may be set to 1 separately by a manual operation of the operator.

In the embodiment that has been described heretofore, when it receives the determination flag update signal from host 80, LCU 90 copies the determined job stored in the HDD of host 80 to the HDD of LCU 90; however, any method may be adopted as long as the determined job can be shared between host 80 and LCU 90. For example, after host 80 has updated the determination flag, host 80 may copy (or overwrite) the determined job to (or on) the HDD of LCU 90.

In the embodiment that has been described heretofore, a solder printer for printing solder on board S before components are mounted on that board S may be added to component mounting line 12, or an inspector for inspecting whether components are mounted properly on board S after the components have been mounted on that board S may be added to component mounting line 12. In addition, although component mounter group 14 and feeder storage container 60 may be adjacent to each other, a solder printer or the like may be interposed between component mounter group 14 and feeder storage container 60.

In the embodiment that has been described heretofore, feeder 30 is exemplified as the component supply device; however, the present disclosure is not particularly limited thereto, and hence, for example, a tray on which multiple components are placed may be adopted as the component supply device.

The component mounting system of the present disclosure may be configured as below.

In the component mounting system of the present disclosure, the production management computer may be configured to prepare an exchange plan of the component supply devices that is performed by the loader based on the determined job as the processing preparation of the determined job. As a result, not all the jobs constitute a preparation target for preparation of the exchange plan, but the determined jobs constitute a preparation target for preparation of the exchange plan. As a result, the load borne by the production management computer in preparing the exchange plan is alleviated.

In the component mounting system of the present disclosure, in a case that there is a determination cancelled job whose determination is cancelled in the determined jobs, the host computer may be configured to share the determination cancelled job with the production management computer, and the production management computer may be configured to exclude the determination cancelled job from the determined jobs. As a result, since the processing preparation is not performed for the job whose determination is canceled in the determined jobs, the load borne by the production management computer in making the processing process for the jobs is alleviated further.

In the component mounting system of the present disclosure, the determination condition may be a condition that a job that is expected to be completed within a specified period of time constitutes a determined job. As a result, since the determined job is limited to jobs that can be completed within the specified period of time, the number of determined jobs is limited. The specified period of time may be, for example, a period of time during which the specified period of time (for example, several days) elapses counting from a point in time when a production is started.

INDUSTRIAL APPLICABILITY

The present disclosure can be applied to a technical field in which a component is mounted on a mounting target using a component mounter group.

REFERENCE SIGNS LIST

10 component mounting system, 12 component mounting line, 14 component mounter group, 18 X-axis rail, 20 component mounter, 20A supply area, 20B stock area, 21 board conveyance device, 22 head, 23 head moving mechanism, 27 touch panel display, 28 mounting control device, 30 feeder, 32 tape reel, 33 tape feeding mechanism, 34 feeder control device, 40 pallet, 42 slot, 45 connector, 50 loader, 50A upper transfer area, 50B lower transfer area, 51 loader moving mechanism, 53 feeder transfer mechanism, 55 encoder, 57 loader control device, 60 feeder storage container, 80 host computer, 82 display, 84 input device, 90 LCU, 92 display, 94 input device

The invention claimed is:

1. A component mounting system comprising:
a component mounter group made up by aligning multiple component mounters, each of the multiple component mounters comprising multiple component supply devices that are set detachably to the multiple component mounters and configured to mount components supplied by the multiple component supply devices on a mounting target, in a conveyance direction of the mounting target;
a storage container configured to detachably support some of the multiple component supply devices in an aligned fashion;
a loader configured to move along the conveyance direction so as to automatically unload and/or load a component supply device of the multiple component supply devices from and/or in a component mounter of the multiple component mounters and the storage container;
a host computer configured to prepare, based on a production plan for producing various types of products in each of which predetermined various types of components are mounted on the mounting target, a job for each of the products and set the job which satisfies a specified determination condition as a determined job; and
a production management computer configured to share the determined job with the host computer, make a preparation for processing the determined job, and thereafter cause the loader to unload and/or load the component supply device based on a result of the preparation for processing the determined job.

2. The component mounting system according to claim 1, wherein the production management computer prepares an exchange plan of the component supply devices that is performed by the loader based on the determined job as a processing preparation for the determined job.

3. The component mounting system according to claim 1, wherein when there is a determination cancelled job whose determination is cancelled in the determined job, the host computer shares the determination cancelled job with the production management computer, and wherein the production management computer excludes the determination cancelled job.

4. The component mounting system according to claim 1, wherein the specified determination condition is a condition that the determined job is a job that is expected to be completed within a specified period of time.

\* \* \* \* \*